United States Patent
Hattori et al.

(10) Patent No.: US 6,495,451 B2
(45) Date of Patent: Dec. 17, 2002

(54) METHOD OF FORMING INTERCONNECT

(75) Inventors: Tsukasa Hattori, Osaka (JP); Takashi Matsuda, Osaka (JP); Hiroshi Masuda, Osaka (JP); Tetsuya Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/753,675

(22) Filed: Jan. 4, 2001

(65) Prior Publication Data

US 2001/0012684 A1 Aug. 9, 2001

(30) Foreign Application Priority Data

Jan. 6, 2000 (JP) ........................... 2000-005767

(51) Int. Cl.$^7$ ........................................... H01L 21/4763
(52) U.S. Cl. ..................... 438/638; 438/622; 438/637; 438/700
(58) Field of Search ................. 438/638, 640, 438/637, 639, 622, 623, 735, 736, 700, 701

(56) References Cited

U.S. PATENT DOCUMENTS

| | | | |
|---|---|---|---|
| 5,897,369 A | | 4/1999 | Jun |
| 5,989,997 A | * | 11/1999 | Lin et al. ............... 438/622 |
| 6,074,942 A | * | 6/2000 | Lou ........................ 438/632 |
| 6,211,068 B1 | * | 4/2001 | Huang .................... 438/634 |

FOREIGN PATENT DOCUMENTS

| | | |
|---|---|---|
| JP | 03-288438 | 12/1991 |
| JP | 09-223731 | 8/1997 |
| JP | 10-199972 | 7/1998 |
| JP | 10-229122 | 8/1998 |
| JP | 10-340952 | 12/1998 |
| JP | 11-154703 | 6/1999 |
| JP | 11-162982 | 6/1999 |
| JP | 2000-012538 | 1/2000 |
| JP | 2000-058647 | 2/2000 |
| TW | 344102 | 11/1998 |

OTHER PUBLICATIONS

Notice of Reasons of Rejection, Patent Application No. 2000-360957 Mailing Date: Apr. 2, 2002.
Notice of Reasons of Rejection, Patent Application No. 2000-360957 Mailing Date: Jul. 2, 2002.
Wolf et al, Silicon Processing for the VLSI ERA, vol. 1, 1986, pp 407-409.*

* cited by examiner

*Primary Examiner*—Tuan H. Nguyen
*Assistant Examiner*—Thanhha Pham
(74) *Attorney, Agent, or Firm*—Nixon Peabody LLP; Thomas W. Cole

(57) ABSTRACT

An interconnect forming method includes the steps of: a) forming a through hole in an insulating film over a substrate; b) depositing a photosensitive masking material over the insulating film as well as inside the hole; c) patterning the material, thereby forming a mask pattern, which has an opening located over the hole and is used to define a trench; d) etching the insulating film to a predetermined depth using the mask pattern, thereby defining a trench pattern, linked to the hole, in an upper part of the insulating film; e) filling in the hole and the trench pattern with a conductive material; and f) before the trench pattern is defined, defining the mask pattern so that no remaining part of the material, which has been filled in the hole, will reach a level higher than the bottom of the trench pattern.

2 Claims, 10 Drawing Sheets

METHOD OF FORMING INTERCONNECT

BACKGROUND OF THE INVENTION

The present invention relates to a method of forming a metal interconnect with good electrical characteristics by a dual damascene process just as intended.

Hereinafter, a known interconnect forming method will be described with reference to FIGS. 5A through 5F.

FIGS. 5A through 5F illustrate cross-sectional structures corresponding to respective process steps for forming interconnects by a known dual damascene process.

First, as shown in FIG. 5A, a first insulating film 102 is deposited on an insulating substrate 101, and a first trench pattern is formed out of the first insulating film 102. Next, the first trench pattern is filled in with a first metallization material 104 (e.g., copper (Cu)) with a first barrier film 103 interposed therebetween and the material 104 and film 103 filled in are planarized. In this manner, a first metal interconnect 105 is formed out of the first barrier film 103 and first metallization material 104. Subsequently, a second insulating film 106 of silicon nitride, for example, is deposited, as a passivation film for the first metallization material 104, over the first insulating film 102 and first metal interconnect 105. Then, an interlevel dielectric film 107 of silicon dioxide, for example, is deposited on the second insulating film 106.

Next, as shown in FIG. 5B, through holes 107a are opened by removing respective parts of the interlevel dielectric film 107 that are located over the first metal interconnect 105.

Then, as shown in FIG. 5C, a positive resist pattern 108, which will be used for defining a second trench pattern and which has openings over the holes 107a, is defined on the interlevel dielectric film 107. Each of the openings of the resist pattern 108 has a diameter equal to or greater than that of an associated one of the holes 107a of the interlevel dielectric film 107. At this point of the process, if the holes 107a, i.e., the openings of the resist pattern 108, have their diameter reduced to a certain size to meet requirements of miniaturization, then the resist material 108a, filled in the holes 107a, cannot be exposed to radiation sufficiently in a subsequent exposure process for the resist pattern 108. This is because the smaller the diameter of the holes 107a or openings, the harder it is for the exposing radiation to reach the deeper levels in the holes 107a. As a result, part of the resist material 108a is unintentionally left inside the holes 107a. The remaining part of the resist material 108a is likely to reach a level higher than the bottom of a second trench pattern that will be defined in the interlevel dielectric film 107 in the next process. According to another method, a resist material may also be intentionally filled in the holes 107a to minimize damage done on the first metal interconnect 105 when the second trench pattern is defined. However, just like the resist material 108a shown in FIG. 5C, the same unwanted results are also obtained even by that alternative method.

Next, as shown in FIG. 5D, the interlevel dielectric film 107 is etched using the resist pattern 108 as a mask, thereby forming the second trench pattern 107b, which is linked to the holes 107a, in the interlevel dielectric film 107. Thereafter, the resist pattern 108 and resist material 108a are removed. In this case, an etching residue 110 of the resist material 108a, which has been filled in the holes 107a, is left inside the second trench pattern 107b. The residue 110 has insulation properties.

Then, as shown in FIG. 5E, a second barrier film 111 is deposited over the holes 107a and second trench pattern 107b, which have been formed in the interlevel dielectric film 107. Thereafter, these holes 107a and pattern 107b are filled in with a second metallization material 112 such as Cu.

Subsequently, as shown in FIG. 5F, unnecessary portions of the second barrier film 111 and second metallization material 112 are removed, thereby forming second metal interconnects 113 out of the second barrier film 111 and second metallization material 112.

According to this known method, however, the insulating etching residue 110, called an "inner crown", is left inside the second trench pattern 107b in the interlevel dielectric film 107 as shown in FIG. 5D. Thus, the second metal interconnects 113 have their resistance increased or might even be disconnected from the first metal interconnect 105 in a worst-case scenario.

SUMMARY OF THE INVENTION

It is therefore an object of the present invention to avoid the unwanted increase in resistance or disconnection of metal interconnects that is usually caused by the etching residue in a known dual damascene process.

The present inventors conducted intensive research on exactly how the "inner crown" appeared where a groove-like trench pattern was formed in the upper part of an insulating film so as to be filled with a metallization material in a subsequent process. As a result, we found that the insulating etching residue extended from a stepped interface between a resist material, with which through holes to be linked to the trench pattern had been filled in, and the insulating film.

Thus, we concluded that if the resist material, filled in the exposed through holes to define a resist pattern for the trench pattern to be formed later, is allowed to reach a level no higher than the bottom of the trench pattern, then the inner crown can be eliminated.

To achieve the above object, an inventive interconnect forming method includes the steps of: a) forming a through hole in an insulating film over a substrate; b) depositing a photosensitive masking material over the insulating film as well as inside the through hole; c) patterning the masking material, thereby forming a mask pattern, which has an opening located over the through hole and is used to define a trench; d) etching the insulating film to a predetermined depth using the mask pattern, thereby defining a trench pattern, which is linked to the through hole, in an upper part of the insulating film; e) filling in the through hole and the trench pattern with a conductive material; and f) defining the mask pattern so that no remaining part of the masking material, which has been filled in the through hole, will reach a level higher than the bottom of the trench pattern. The step f) is performed before the step d).

According to the inventive method, before the trench pattern is formed, the mask pattern, used to form the trench, is defined so that no remaining part of the masking material, which has been filled in the through hole, will reach a level higher than the bottom of the trench pattern. Thus, no etching residue of the masking material is left in the upper part of the through hole. And it is possible to prevent the etching residue from increasing the resistance of the metal interconnects or disconnecting the interconnects from each other. As a result, highly reliable metal interconnects with good electrical characteristics can be obtained.

In one embodiment of the present invention, the masking material may be exposed in the step c) to radiation at such a dose as needed for the radiation to pass through the masking material on the insulating film and then the exposed masking material may be developed, thereby forming the mask pattern out of the masking material.

In another embodiment of the present invention, the step d) may include the step of rounding a corner between the top of the through hole and the bottom of the trench pattern in the insulating film.

In still another embodiment, the step f) may include the steps of: i) depositing a negative resist as the masking material on the insulating film in the step b); and ii) leaving part of the negative resist, which has been filled in the through hole, unexposed and then developing and removing the unexposed part of the negative resist in the step c).

In yet another embodiment, the step f) may include the steps of: i) stuffing the through hole with a filler between the steps a) and b); ii) depositing the masking material over the insulating film as well as over the through hole, which has been stuffed with the filler, in the step b); and iii) selectively removing the filler between the steps c) and d).

In this particular embodiment, a lower part of the filler is preferably left in the step iii) inside the through hole so that the top of the lower part will be no higher than the bottom of the trench pattern.

Also, in this embodiment, the masking material is preferably a positive resist, and the filler is preferably a resist that is photosensitive in a wavelength range broader than a wavelength range in which the positive resist is photosensitive.

In yet another embodiment, the step f) may include the steps of: i) forming a cap film, which closes the through hole, on the insulating film between the steps a) and b); ii) depositing the masking material over the cap film on the insulating film in the step b); and iii) forming the trench pattern by etching the cap film and the insulating film using the mask pattern in the step d).

In this particular embodiment, the cap film is preferably formed by a vapor phase epitaxy process that results in a low step coverage.

In still another embodiment, the step f) may include the steps of i) forming the through hole using a first exposure mask in the step a) and ii) forming the mask pattern in the step c). The step ii) includes the sub-steps of: exposing a first part of the masking material using the first exposure mask; exposing a second part of the masking material using a second exposure mask; and developing the exposed masking material. The first part is located over the through hole. And the second exposure mask has an opening over the second part, which is also located over the through hole, and is used to form the trench.

In this particular embodiment, the first part of the masking material is preferably exposed at an optimized dose using the first exposure mask so that after the masking material is developed, part of the masking material inside the through hole will be left under the bottom of the trench pattern.

DESCRIPTION OF THE PREFERRED EMBODIMENTS

Embodiment 1

Hereinafter, a first embodiment of the present invention will be described with reference to FIGS. 1A through 1G.

FIGS. 1A through 1G illustrate cross-sectional structures corresponding to respective process steps for forming metal interconnects by a dual damascene process according to the first embodiment.

Figure 1A:
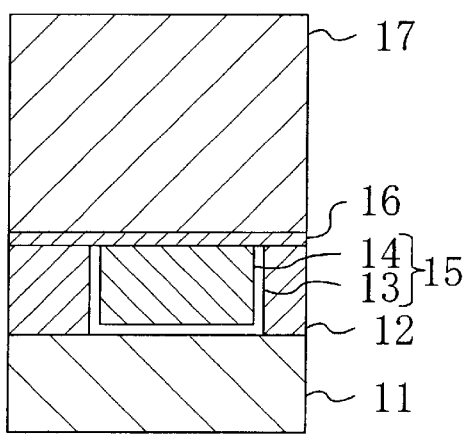
FIGS. 1A through 1G are cross-sectional views illustrating respective process steps for forming interconnects according to a first embodiment of the present invention.

First, as shown in FIG. 1A, an insulating film (e.g., a silicon dioxide film) 12 is deposited on an insulating substrate 11. As used herein, the "insulating substrate" includes a semiconductor substrate with an insulating film deposited thereon. Although not illustrated in any of the accompanying drawings, either active devices like transistors or an additional multi-level interconnection structure may be formed on the substrate 11. Next, a first trench pattern is defined in the insulating film 12 by photolithography and etching processes. Then, a first barrier film 13 of tantalum nitride, for example, may be formed by an evaporation process on the side faces and bottom of the first trench pattern if necessary. The first barrier film 13 is provided to prevent the metallization material for the resultant interconnect from diffusing and to improve the reliability of the interconnect. Thereafter, the first trench pattern is filled in with a first metallization material 14 of Cu, for example. Subsequently, unnecessary portions of the first barrier film 13 and the first metallization material 14 are removed by a chemical/mechanical polishing (CMP) process, thereby planarizing the upper surfaces thereof. In this manner, a first metal interconnect 15 is formed out of the first barrier film 13 and first metallization material 14. Thereafter, a passivation film 16 of silicon nitride, for example, is deposited at least on the upper surface of the first metal interconnect 15 to protect the interconnect 15. Then, an interlevel dielectric film 17 of silicon dioxide, for example, is deposited on the passivation film 16. In this case, the interlevel dielectric film 17 may have a multilayer structure and the passivation film 16 may be omitted.

Alternatively, the first metal interconnect 15 shown in FIG. 1A may be formed in the following manner. Specifically, first, the first barrier film 13 and first metallization material 14 are deposited in this order over the insulating substrate 11. Next, the first barrier film 13 and first metallization material 14 are patterned by photolithography and etching processes, for example, to obtain the first metal interconnect 15. Then, the insulating film 12 and interlevel dielectric film 17 are deposited thereon. Thereafter, unnecesary portions of the interlevel dielectric film 17 are removed by a CMP process, for example. According to this alternative method, the first barrier film 13 does not exist on the side faces of the first metal interconnect 15.

Figure 1C:
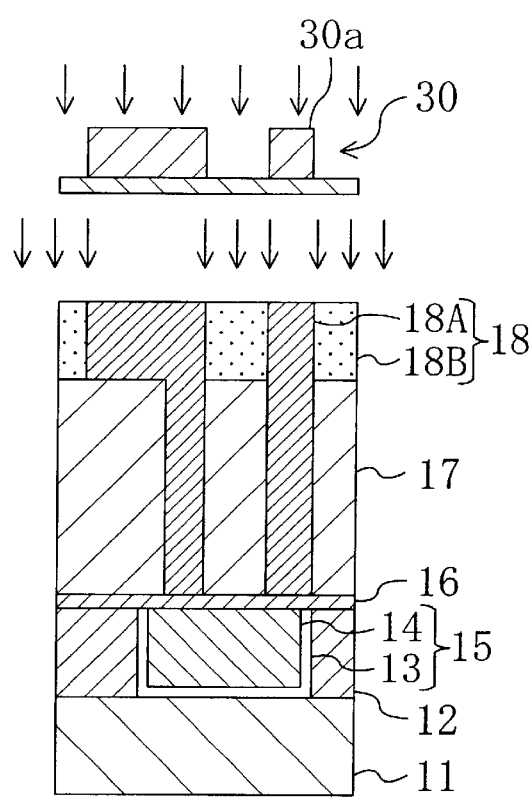
Figure 1B:
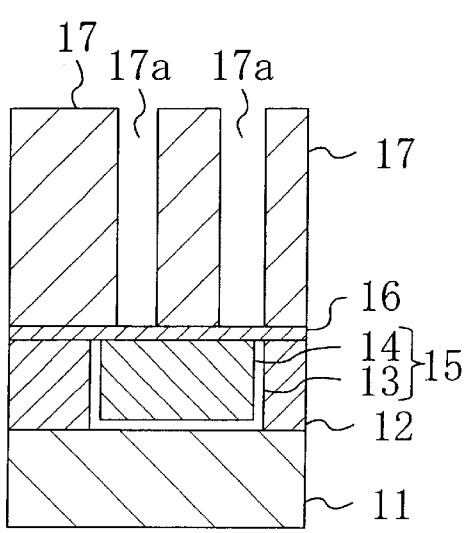

Next, as shown in FIG. 1B, parts of the interlevel dielectric film 17, which are located over the first metal interconnect 15, are removed by photolithography and etching processes to form through holes (or contact holes) 17a. In this process step, the passivation film 16 may also be etched so that the first metal interconnect 15 is partially exposed at the bottom of the holes 17a. Optionally, after the holes 17a have been formed, the holes 17a may be partially stuffed with a filler (e.g., passivation resist) so that the top of the filler will be lower (or deeper) than the bottom of a second trench pattern to be formed in a subsequent process step. In this case, the filler is provided to protect the surface portions of the passivation film 16 or first metal interconnect 15 that are exposed at the bottom of the holes 17a.

Next, as shown in FIG. 1C, the entire surface of the interlevel dielectric film 17, as well as the inside of the holes 17a, is coated with a negative resist 18 so that exposed parts of the resist 18 will be left without being developed.

Subsequently, the negative resist 18 is exposed to radiation using an exposure mask (or reticle) 30, which has been obtained by transferring a second trench pattern onto a light-blocking film 30a of chromium, for example. In this case, the exposing radiation does not pass through portions of the light-blocking film 30a corresponding to parts 18A of the negative resist 18 that are located in the regions where the second trench pattern will be formed or that have been filled in the holes 17a. As a result, those parts 18A are unexposed and left.

Figure 1D:
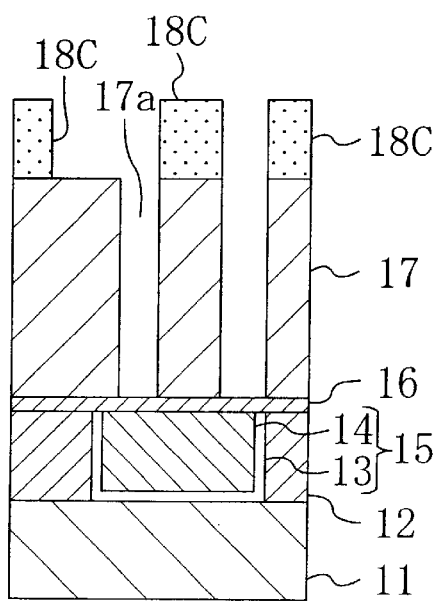

Then, as shown in FIG. 1D, the negative resist 18 is developed to remove the unexposed parts 18A of the negative resist 18 and leave the exposed parts 18B thereof. As a result, a mask pattern 18c, having openings in the regions where the second trench pattern will be formed, is obtained. In this case, the unexposed parts 18A, which have been filled in the holes 17a, are also removed because those parts 18A were not exposed to the radiation.

Figure 1E:
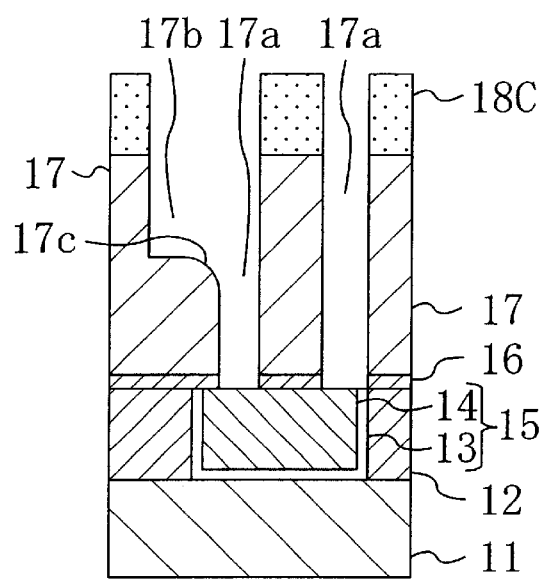

Thereafter, as shown in FIG. 1E, the interlevel dielectric film 17 is etched to a predetermined depth using the mask pattern 18C, thereby forming the second trench pattern 17b in the upper part of the film 17 so that the bottom of the pattern 17b is linked to the hole 17a. This process step is performed as a dry etching process using a mixture containing $CH_4$, $CHF_3$ and Ar gases, in which the sputtered atoms are ejected strongly. As a result, the corner 17c of the interlevel dielectric film 17 between the top of the through hole 17a and the bottom of the second trench pattern 17b is rounded. In addition, no resist is left in the upper part of each through hole 17a, i.e., at a level higher than the bottom of the second trench pattern 17b. Accordingly, no etching residue is left inside the openings of the interlevel dielectric film 17. Subsequently, if the first metal interconnect 15 has not been exposed yet at the bottom of the holes 17a, parts of the passivation film 16, exposed at the bottom of the holes 17a, are etched away, thereby exposing the first metal interconnect 15 there.

Figure 1G:
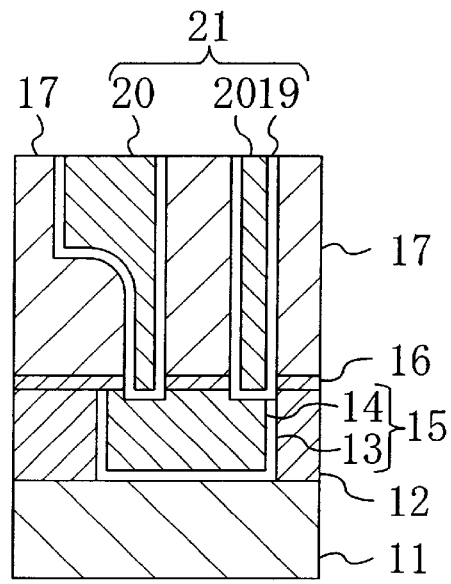
Figure 1F:
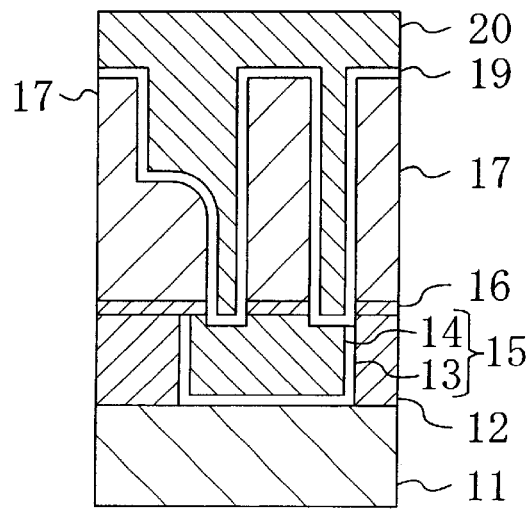

Next, as shown in FIG. 1F, the mask pattern 18C is removed. Then, if necessary, a second barrier film 19 of tantalum nitride, for example, may be deposited over the entire surface of the interlevel dielectric film 17 as well as inside the holes 17a and second trench pattern 17b. The second barrier film 19 is provided to improve the reliability of the resultant metal interconnects. Subsequently, a second metallization material 20 of Cu, for example, is deposited over the entire surface of the second barrier film 19 to fill in the holes 17a and second trench pattern 17b. In this case, the corner 17c between the top of the through hole 17a and the bottom of the second trench pattern 17b is rounded. Accordingly, even if the diameter of the through hole 17a is relatively small, the second metallization material 20 can reach the bottom of the holes 17a just as intended. For that reason, the first and second metal interconnects 15 and 21 are much less likely to be disconnected from each other.

Thus, decrease in reliability of the interconnects, which might be caused if the metallization material could not be filled in sufficiently, is avoidable according to this embodiment.

Finally, as shown in FIG. 1G, unnecessary portions of the second barrier film 19 and second metallization material 20 on the interlevel dielectric film 17 are removed by a CMP process, for example, thereby planarizing the upper surfaces thereof. In this manner, the second metal interconnects 21 are formed out of the second barrier film 19 and the second metallization material 20 and are electrically connected to the first metal interconnect 15. It should be noted that the first and second barrier films 13 and 19 do not have to be made of the same material. And the first and second metallization materials 14 and 20 do not have to be the same, either.

Optionally, upper-level metal interconnection layers or an interconnection layer for wire bonding may be formed after that.

As described above, according to the first embodiment, the negative resist 18 is used to define the second trench pattern 17b, which will be linked to the holes 17a, in the upper part of the interlevel dielectric film 17. Accordingly, the unexposed parts 18A of the negative resist 18, which have entered the holes 17a, are not exposed to the radiation, and therefore, melted and removed when developed. That is to say, no residue of the resist 18 for the second trench pattern 17b is left inside the holes 17a and the second metal interconnects 21 will not be affected by any etching residue. Thus, it is possible to prevent the metal interconnects from increasing their resistance or from being disconnected from each other. As a result, highly reliable metal interconnects with improved electrical characteristics can be obtained by a dual damascene process.

Embodiment 2

Hereinafter, a second embodiment of the present invention will be described with reference to FIGS. 2A through 2H.

FIGS. 2A through 2H illustrate cross-sectional structures corresponding to respective process steps for forming interconnects by a dual damascene process according to the second embodiment. In FIGS. 2A through 2H, the same members as those illustrated in FIGS. 1A through 1G are identified by the same reference numerals.

Figure 2A:
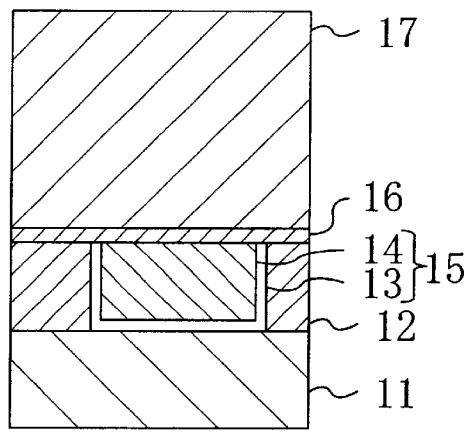
FIGS. 2A through 2H are cross-sectional views illustrating respective process steps for forming interconnects according to a second embodiment of the present invention.

First, as shown in FIG. 2A, an opening of an insulating film 12 on an insulating substrate 11 is filled in with a first barrier film 13 and a first metallization material 14, thereby forming a first metal interconnect 15 as in the first embodiment. As used herein, the "insulating substrate" 11 includes a semiconductor substrate with an insulating film deposited thereon. Although not illustrated in any of the accompanying drawings, either active devices like transistors or an additional multi-level interconnection structure may be formed on the substrate 11. Next, a passivation film 16 and an interlevel dielectric film 17 are deposited in this order over the insulating film 12 and first metal interconnect 15.

Figure 2C:
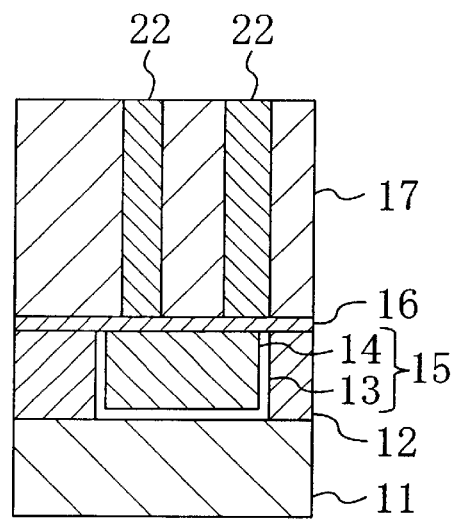
Figure 2B:
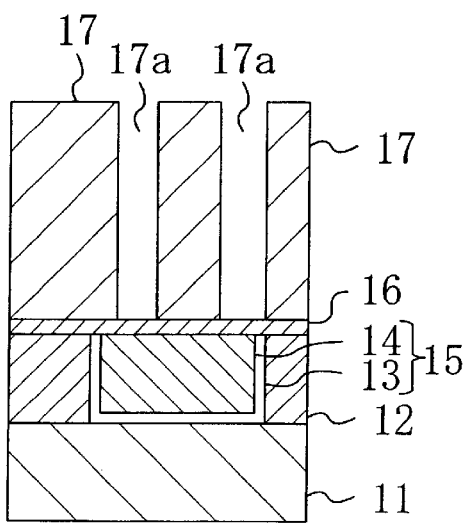

Next, as shown in FIG. 2B, parts of the interlevel dielectric film 17, which are located over the first metal interconnect 15, are removed to form through holes 17a. In this process step, parts of the passivation film 16, which are exposed at the bottom of the holes 17a, may also be etched so that the first metal interconnect 15 is partially exposed at the bottom of the holes 17a.

Subsequently, as shown in FIG. 2C, the entire surface of the interlevel dielectric film 17, as well as the inside of the holes 17a, is coated with a first positive resist, which may be exposed to an i-line at a wavelength of about 365 nm, for example. The first positive resist is applied as filler. Then, the first positive resist is exposed, without using any mask, to radiation at such an exposure dose as needed for the radiation to pass through the part of the resist on the interlevel dielectric film 17 entirely. Then, the first positive resist is developed, thereby leaving parts 22 of the first positive resist inside the holes 17a. In this process step, the upper surface of those remaining parts 22 of the first positive resist is preferably leveled with that of the interlevel dielectric film 17.

Figure 2D:
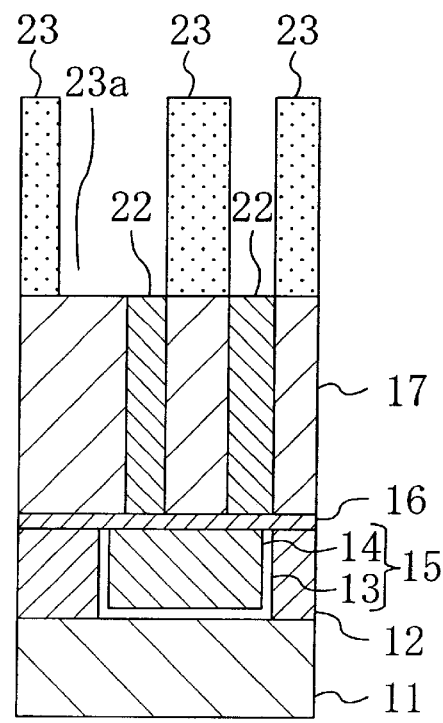

Then, as shown in FIG. 2D, the entire surface of the interlevel dielectric film 17, as well as the upper surface of the first positive resist 22, is coated with a second positive resist for KrF radiation. The second positive resist is photosensitive to exposing radiation with a wavelength of 248 nm or less. Thereafter, the second positive resist is exposed to the KrF radiation at a wavelength of 248 nm or less and then developed, thereby defining a second positive resist pattern 23 with an opening 23a for a second trench pattern. In this case, the first positive resist 22 is not photosensitive to the radiation, to which the second positive resist 23 is photosensitive, and is left as it is inside the holes 17a.

Figure 2E:
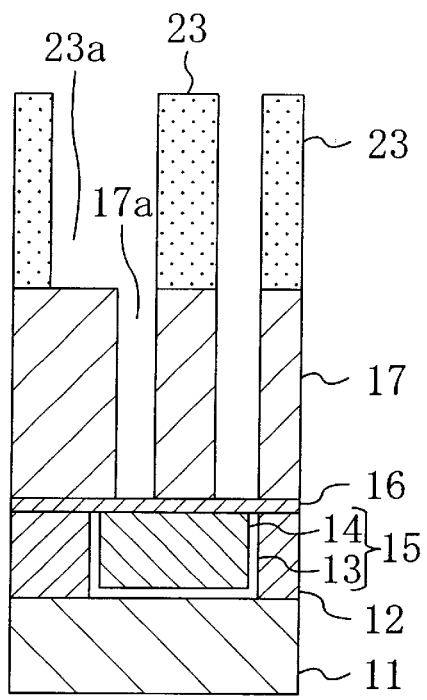

Next, as shown in FIG. 2E, the first positive resist 22, which is left inside the holes 17a, is exposed to an i-line and then developed in a predetermined way. In this manner, only the first positive resist 22 inside the holes 17a can be removed selectively with the second positive resist pattern 23, having the opening 23a for the second trench pattern, left as it is. This is because the second positive resist pattern 23 is not photosensitive to the i-line. By filling in the holes 17a with the first positive resist 22 with a different exposure wavelength, the second positive resist 23 does not enter the holes 17a when applied to define the second trench pattern. In this case, parts of the first positive resist 22 as the filler, which are located lower than the bottom of the second trench pattern to be formed in a subsequent process step, may be left to protect the exposed portions of the passivation film 16 or first metal interconnect 15 at the bottom of the holes 17a.

Figure 2G:
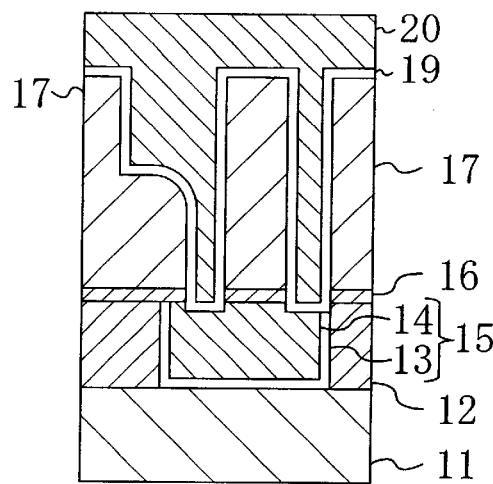
Figure 2F:
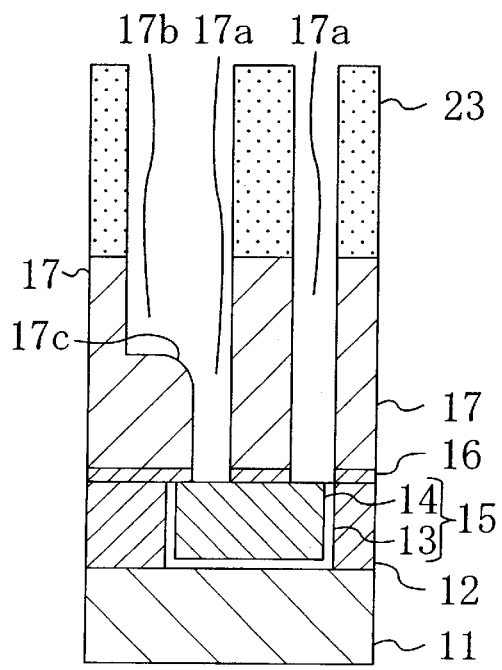
Figure 2H:
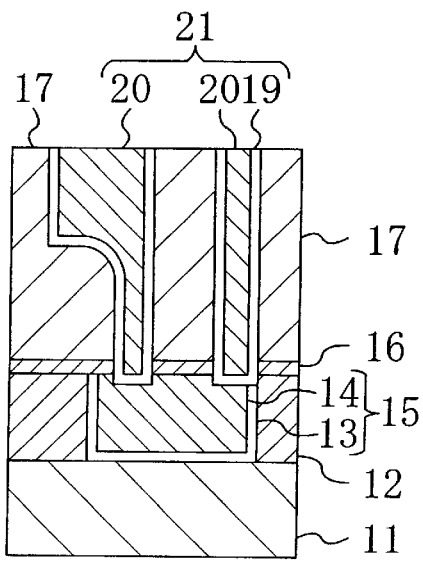

Next, as shown in FIG. 2F, the interlevel dielectric film 17 is etched to a predetermined depth using the second positive resist pattern 23 as a mask, thereby forming the second trench pattern 17b in the upper part of the interlevel dielectric film 17 so that the bottom of the pattern 17b is linked to the holes 17a. This etching process step is performed in such a manner that the corner 17c of the interlevel dielectric film 17 between the top of the through hole 17a and the bottom of the second trench pattern 17b is rounded. In the upper part of each through hole 17a, i.e., over the bottom of the second trench pattern 17b, the first positive resist 22 has been filled in and then selectively removed. Accordingly, the second positive resist pattern 23 for the second trench pattern 17b does not enter the holes 17a. Thus, no etching residue of the second positive resist pattern 23 is left on the inner surfaces of the second trench pattern 17b in the interlevel dielectric film 17. Subsequently, if the first metal interconnect 15 has not been exposed yet at the bottom of the holes 17a, parts of the passivation film 16, exposed at the bottom of the holes 17a, are etched away, thereby exposing the first interconnect 15 at the bottom of the holes 17a.

The succeeding process steps are performed as in the first embodiment. Specifically, as shown in FIG. 2G, the second positive resist pattern 23 is removed. Then, a second barrier film 19 may be deposited over the entire surface of the interlevel dielectric film 17 as well as inside the holes 17a and second trench pattern 17b. Subsequently, the holes 17a and second trench pattern 17b are filled in with a second metallization material 20. Finally, unnecessary portions of the second barrier film 19 and second metallization material 20 on the interlevel dielectric film 17 are removed and the upper surfaces thereof are planarized. In this manner, the second metal interconnects 21 are formed and electrically connected to the first metal interconnect 15.

In the second embodiment, before the interlevel dielectric film 17 is patterned to form the trench structure, which will be linked to the holes 17a, in the upper part of the film 17, the holes 17a are filled in with the first positive resist 22 that should be exposed to an i-line. In addition, the second positive resist pattern 23 for KrF radiation, which has a different exposure wavelength from that of the first positive resist 22, is used as a resist for the second trench pattern. Accordingly, after the second positive resist pattern 23 with the opening 23a for the second trench pattern 17b has been defined, the first positive resist 22, which is filled in the holes 17a, can be removed selectively without deforming the second positive resist pattern 23. For that reason, no residue of the second positive resist pattern 23 for the second trench pattern 17b is left inside the holes 17a and the second metal interconnects 21 will not be affected by any etching residue. Thus, it is possible to prevent the metal interconnects from increasing their resistance or from being disconnected from each other. In this manner, highly reliable metal interconnects with improved electrical characteristics can be obtained by a dual damascene process.

In this case, the corner 17c between the top of the through hole 17a and the bottom of the second trench pattern 17b is rounded. Accordingly, even if the diameter of the holes 17a is relatively small, the second metallization material 20 can reach the bottom of the holes 17a just as intended. For that reason, the first and second metal interconnects 15 and 21 are much less likely to be disconnected from each other. Thus, decrease in reliability of the interconnects, which might be caused if the metallization material could not be filled in sufficiently, is avoidable according to this embodiment.

It should be noted that the first barrier film 13 and the passivation film 16 are not always necessary.

In the second embodiment, a resist to be exposed to an i-line is used as the first positive resist 22. Alternatively, any other resist may also be used so long as the resist is photosensitive to radiation with a wavelength longer than the exposure wavelength of the second positive resist pattern 23. In the illustrated embodiment, the second positive resist pattern 23 is a resist that is photosensitive to KrF radiation at an exposure wavelength of 248 nm. Accordingly, the first positive resist 22 may be a resist that is photosensitive to a g-line at an exposure wavelength of about 436 nm.

Embodiment 3

Hereinafter, a third embodiment of the present invention will be described with reference to FIGS. 3A through 3G.

FIGS. 3A through 3G illustrate cross-sectional structures corresponding to respective process steps for forming interconnects by a dual damascene process according to the third embodiment. In FIGS. 3A through 3G, the same members as those illustrated in FIGS. 1A through 1G are identified by the same reference numerals.

Figure 3A:
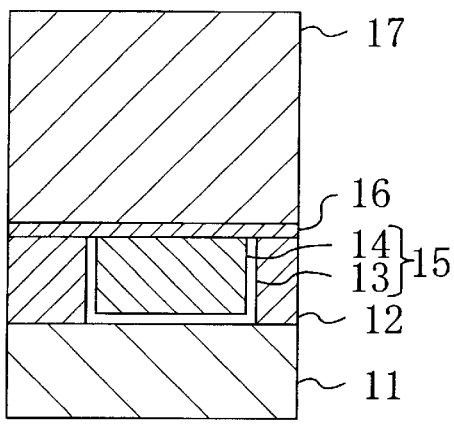
FIGS. 3A through 3G are cross-sectional views illustrating respective process steps for forming interconnects according to a third embodiment of the present invention.

First, as shown in FIG. 3A, an opening in an insulating film 12 on an insulating substrate 11 is filled in with a first barrier film 13 and a first metallization material 14, thereby forming a first metal interconnect 15 as in the first embodiment. As used herein, the "insulating substrate" 11 includes a semiconductor substrate with an insulating film deposited thereon. Although not illustrated in any of the accompanying drawings, either active devices like transistors or an additional multi-level interconnection structure may be formed on the substrate 11. Next, a passivation film 16 and an interlevel dielectric film 17 are deposited in this order over the insulating film 12 and first metal interconnect 15.

Figure 3C:
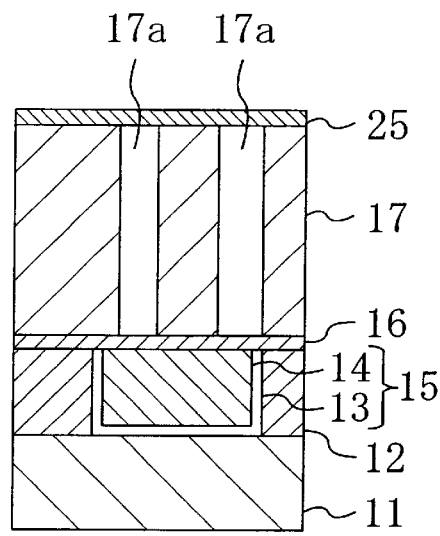
Figure 3B:
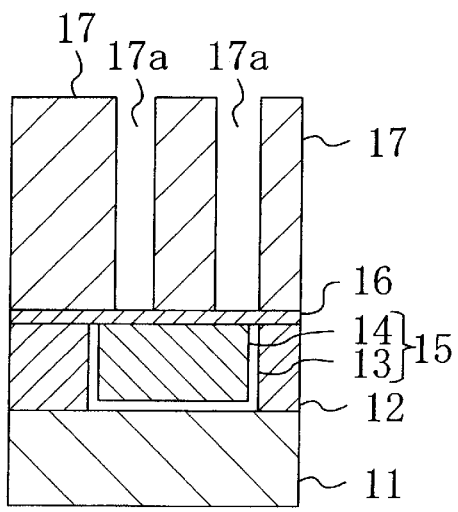

Next, as shown in FIG. 3B, parts of the interlevel dielectric film 17, which are located over the first metal interconnect 15, are removed to form through holes 17a. In this process step, parts of the passivation film 16, which are exposed at the bottom of the holes 17a, may also be etched so that the first metal interconnect 15 is partially exposed at the bottom of the holes 17a.

Subsequently, as shown in FIG. 3C, a cap insulating film 25 of silicon dioxide, for example, is formed on the interlevel dielectric film 17 to close the openings, i.e., the holes 17a. The cap insulating film 25 may be formed by a vapor phase epitaxy process that will result in a low step coverage, e.g., a parallel plate plasma enhanced CVD process using mono-silane gas. That is to say, the cap insulating film 25 is a plasma oxide film in that case.

Figure 3D:
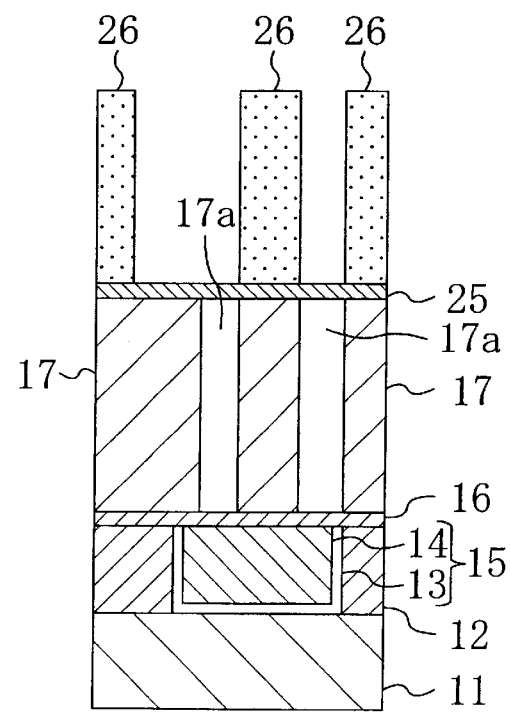

Then, as shown in FIG. 3D, a resist pattern 26 is defined on the cap insulating film 25. The resist pattern 26 has openings that will be used to define a second trench pattern, are located over the holes 17a and are greater in width than the holes 17a. At this point in time, the holes 17a have still been closed with the cap insulating film 25, and the resist pattern 26 does not enter the holes 17a.

Figure 3E:
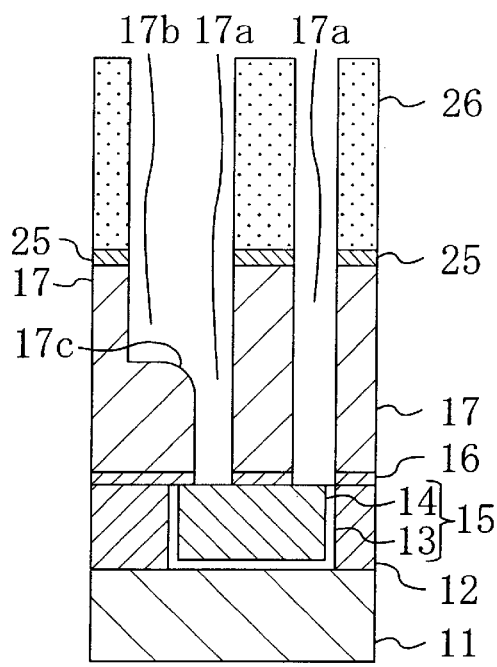

Next, as shown in FIG. 3E, the cap insulating film 25 is etched using the resist pattern 26 as a mask. Then, the interlevel dielectric film 17 is etched to a predetermined depth using the resist pattern 26 as a mask, too. In this manner, a second trench pattern 17b is formed in the upper part of the interlevel dielectric film 17 so that the bottom of the pattern 17b is linked to the holes 17a. This etching process step is performed in such a manner that a corner 17c of the interlevel dielectric film 17 between the top of the through hole 17a and the bottom of the second trench pattern 17b is rounded. Until just before this etching process, the holes 17a have been closed with the cap insulating film 25. Accordingly, the resist pattern 26 cannot have entered the holes 17a. Thus, no etching residue of the resist pattern 26 is left inside the openings of the interlevel dielectric film 17. Subsequently, if the first metal interconnect 15 has not been exposed yet at the bottom of the holes 17a, parts of the passivation film 16, which are exposed at the bottom of the holes 17a, are etched away, thereby exposing the first interconnect 15 there.

Figure 3G:
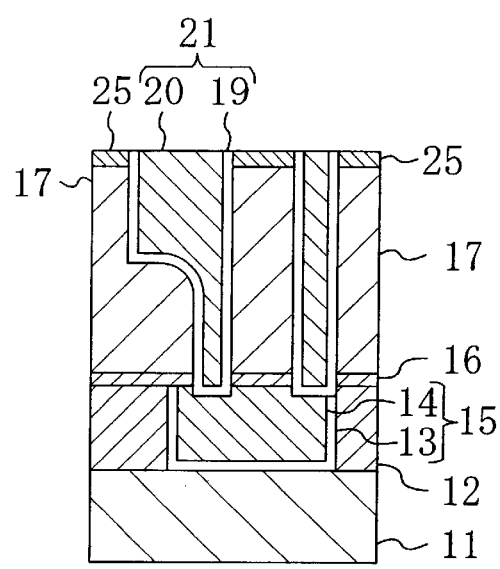
Figure 3F:
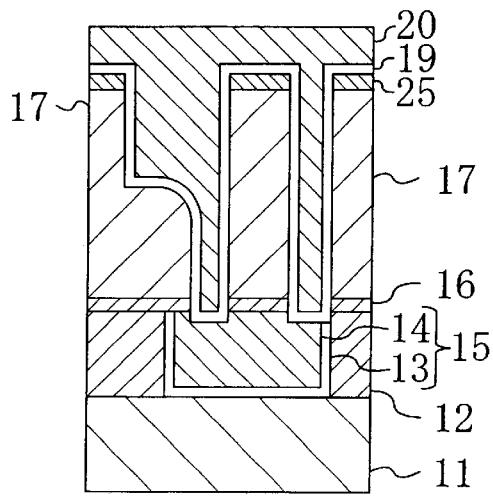

The succeeding process steps are performed as in the first embodiment. Specifically, as shown in FIG. 3F, the resist pattern 26 is removed. Then, a second barrier film 19 may be deposited over the entire surface of the interlevel dielectric film 17 as well as inside the holes 17a and second trench pattern 17b. Subsequently, the holes 17a and second trench pattern 17b are filled in with a second metallization material 20. Finally, as shown in FIG. 3G, unnecessary portions of the second barrier film 19 and second metallization material 20 on the interlevel dielectric film 17 are removed and the upper surfaces thereof are planarized. In this manner, second metal interconnects 21 are formed and electrically connected to the first metal interconnect 15. In this process step, the cap insulating film 25 may also be removed along with those unnecessary portions.

In this embodiment, before the interlevel dielectric film 17 is patterned to form the trench structure, which should be linked to the holes 17a, in the upper part of the film 17, the holes 17a are closed with the cap insulating film 25. Accordingly, no residue of the resist pattern 26 for the second trench pattern 17b is left inside the holes 17a and the second metal interconnects 21 will not be affected by any etching residue. Thus, it is possible to prevent the metal interconnects from increasing their resistance or from being disconnected from each other. In this manner, highly reliable metal interconnects with improved electrical characteristics can be obtained by a dual damascene process.

In this case, the corner 17c between the top of the through hole 17a and the bottom of the second trench pattern 17b is rounded. Accordingly, even if the diameter of the holes 17a is relatively small, the second metallization material 20 can reach the bottom of the holes 17a just as intended. For that reason, the first and second metal interconnects 15 and 21 are much less likely to be disconnected from each other. Thus, decrease in reliability of the interconnects, which might be caused if the metallization material could not be filled in sufficiently, is avoidable according to this embodiment.

It should be noted that the first barrier film 13 and passivation film 16 are not always necessary.

Embodiment 4

Hereinafter, a fourth embodiment of the present invention will be described with reference to FIGS. 4A through 4G.

FIGS. 4A through 4G illustrate cross-sectional structures corresponding to respective process steps for forming interconnects by a dual damascene process according to the fourth embodiment. In FIGS. 4A through 4G, the same members as those illustrated in FIGS. 1A through 1G are identified by the same reference numerals.

Figure 4A:
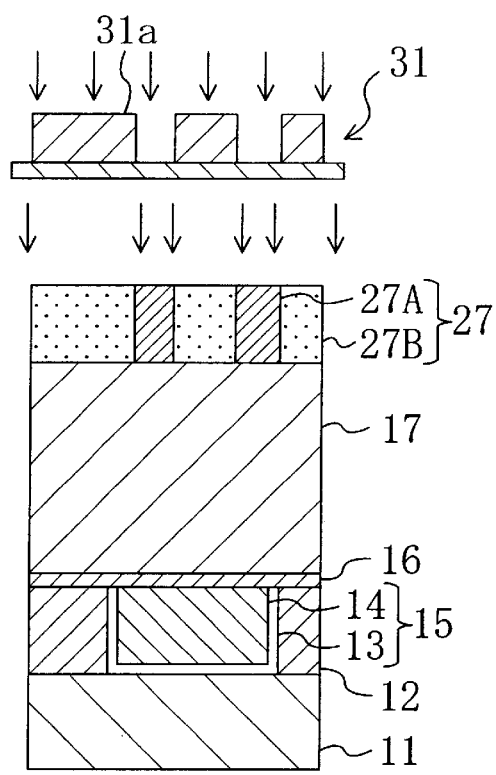
FIGS. 4A through 4G are cross-sectional views illustrating respective process steps for forming interconnects according to a fourth embodiment of the present invention.

First, as shown in FIG. 4A, an opening in an insulating film 12 on an insulating substrate 11 is filled in with a first barrier film 13 and a first metallization material 14, thereby forming a first metal interconnect 15 as in the first embodiment. As used herein, the "insulating substrate" 11 includes a semiconductor substrate with an insulating film deposited thereon. Although not illustrated in any of the accompanying drawings, either active devices like transistors or an additional multi-level interconnection structure may be formed on the substrate 11. Next, a passivation film 16 and an interlevel dielectric film 17 are deposited in this order over the insulating film 12 and first metal interconnect 15.

Thereafter, the interlevel dielectric film 17 is coated with a first positive resist 27. Subsequently, the first positive resist 27 is exposed to radiation using an exposure mask (or reticle) 31, which has been obtained by transferring a pattern for through holes onto a light-blocking film 31a of chromium, for example. As a result, parts 27A of the first positive resist 27, which are located over the regions where the holes 17a will be formed, are exposed to the radiation. On the other hand, the other parts 27B of the first positive resist 27 are not exposed to the radiation because the light-blocking film 31a of the exposure mask 31 blocks the radiation from reaching those parts 27B. As a result, the non-exposed parts 27B are left as they are.

Figure 4B:
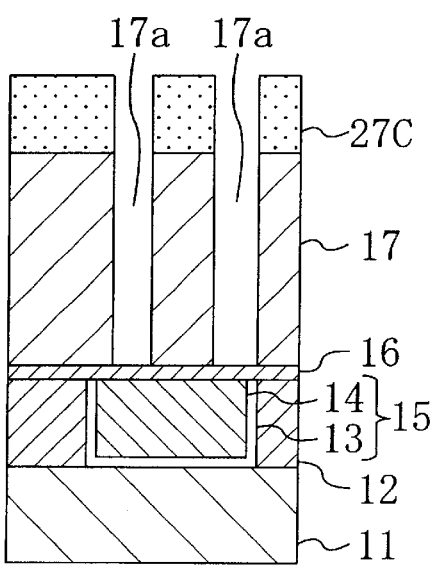

Next, as shown in FIG. 4B, the first positive resist 27 is developed. Then, the exposed parts 27A of the first positive resist 27 are removed, while the non-exposed parts 27B thereof are left as they are. In this manner, a first mask pattern 27C, which has openings for forming the holes 17a over the first metal interconnect 15, is defined. Thereafter, the interlevel dielectric film 17 is etched using the first mask pattern 27C, thereby forming the holes 17a in respective parts of the interlevel dielectric film 17 that are located over the first metal interconnect 15. In this process step, parts of the passivation film 16, which are exposed at the bottom of the holes 17a, may also be etched so that the first metal interconnect 15 is partially exposed at the bottom of the holes 17a.

Figure 4C:
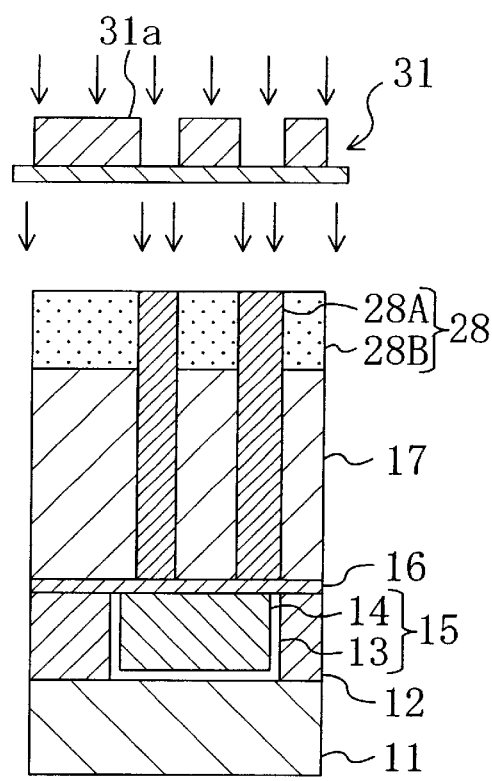

Thereafter, as shown in FIG. 4C, the first mask pattern 27C is removed and then the entire surface of the interlevel dielectric film 17, as well as inside the holes 17a, is coated with a second positive resist 28. Subsequently, using the same mask 31 as that used in the step shown in FIG. 4A again, parts 28A of the second positive resist 28, which have been filled in the holes 17a, are exposed to radiation at a dose at which the exposed parts 28A are photosensitive to the radiation. As a result, non-exposed parts 28B of the second positive resist 28 are left on the interlevel dielectric film 17 as they are.

Figure 4D:
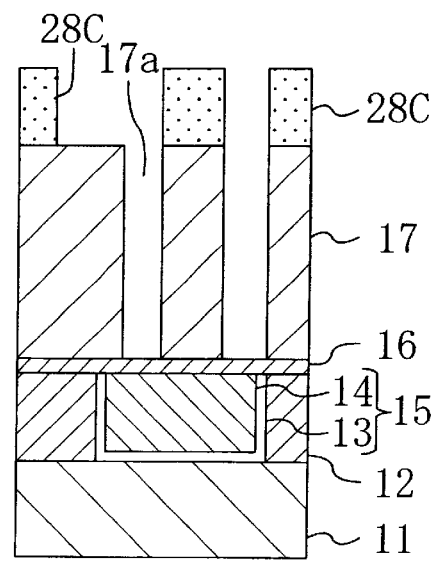

Next, as shown in FIG. 4D, other parts of the second positive resist 28 are exposed to the radiation using an exposure mask (not shown) having openings that are located over the holes 17a and are greater in width than the holes 17a. Then, the second positive resist 28 is developed, thereby forming a second mask pattern 28C out of the second positive resist 28 without leaving the exposed parts 28A of the second positive resist 28 inside the holes 17a. The second mask pattern 28C has openings that will be used to define a second trench pattern. Optionally, the exposed parts 28A of the second positive resist 28 may be partially left inside the holes 17a by optimizing the exposure conditions so that no remaining parts 28A will reach a level higher than the bottom of the second trench pattern to be defined in the next process step. In that case, parts of the passivation film 16 or first metal interconnect 15, which are exposed at the bottom of the holes 17a, can be protected with the remaining parts 28A of the second positive resist 28.

Figure 4E:
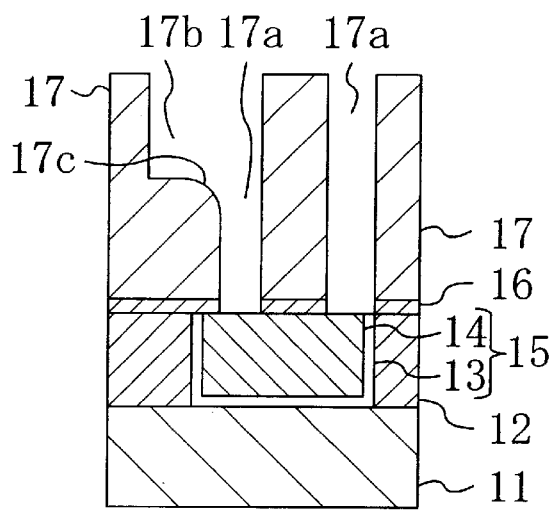

Next, as shown in FIG. 4E, the interlevel dielectric film 17 is etched to a predetermined depth using the second mask pattern 28C, thereby forming the second trench pattern 17b in the upper part of the interlevel dielectric film 17 so that the bottom of the pattern 17b is linked to the holes 17a. This etching process step is performed in such a manner that a corner 17c of the interlevel dielectric film 17 between the top of the through hole 17a and the bottom of the second trench pattern 17b is rounded. The exposed parts 28A of the second positive resist 28 may be partially left inside the holes 17a. But those remaining parts 28A do not reach, but are located lower than, the bottom of the second trench pattern 17b if any. This is because other exposed parts 28A, which were located higher than the bottom of the second trench pattern 17b, have already been removed by the exposure and development processes using the same mask 31 as that used in the step shown in FIG. 4A. Thus, no etching residue of the resist 28 is left inside the openings of the interlevel dielectric film 17. Subsequently, if the first metal interconnect 15 has not been exposed yet at the bottom of the holes 17a, parts of the passivation film 16, which are exposed at the bottom of the holes 17a, are etched away, thereby exposing the first interconnect 15 there.

Figure 4G:
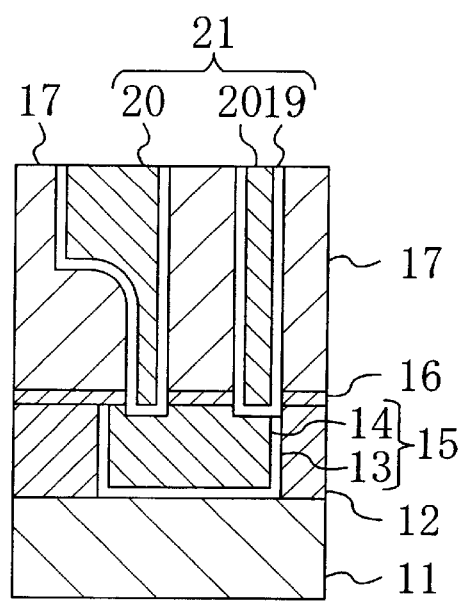
Figure 4F:
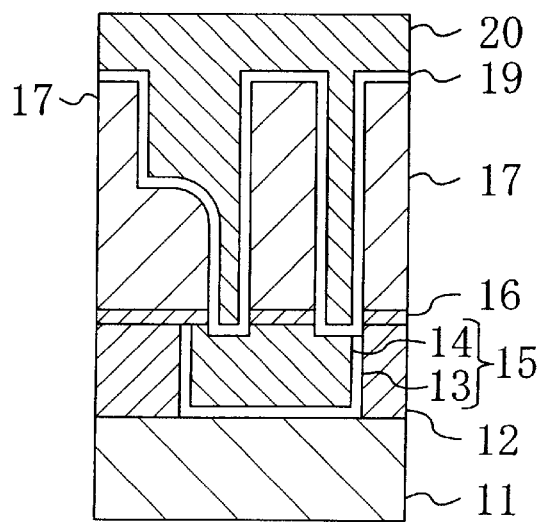
Figure 5A:
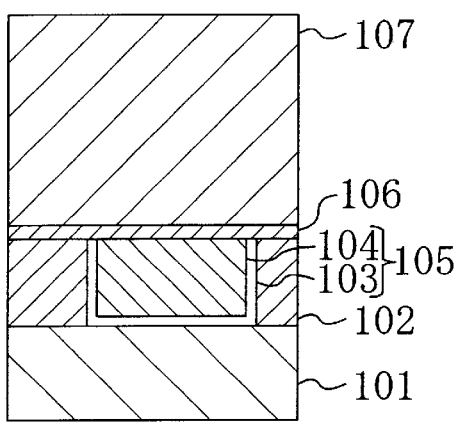
FIGS. 5A through 5F are cross-sectional views illustrating respective process steps for forming interconnects by a known dual damascene process.
Figure 5C:
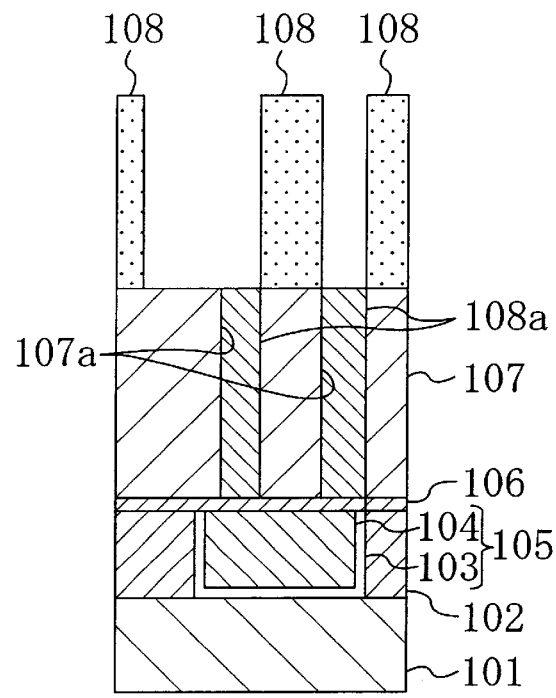
Figure 5B:
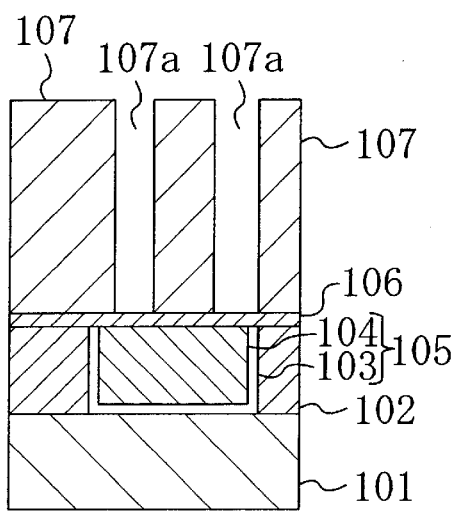
Figure 5D:
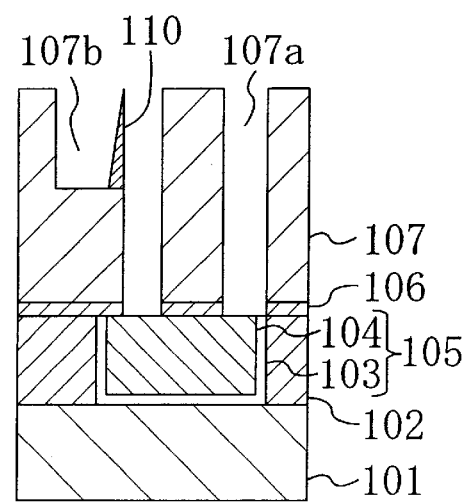
Figure 5E:
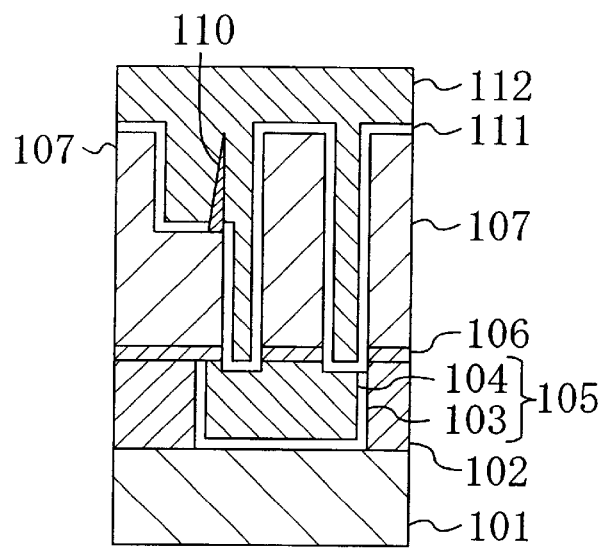
Figure 5F:
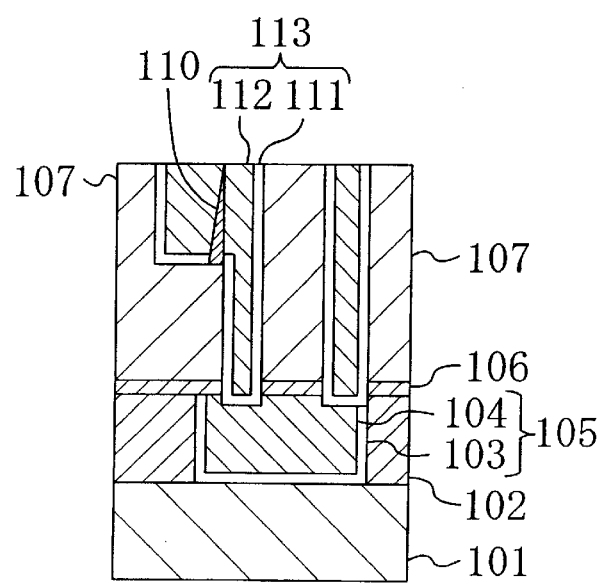

The succeeding process steps are performed as in the first embodiment. Specifically, as shown in FIG. 4F, a second barrier film 19 may be deposited over the entire surface of the interlevel dielectric film 17 as well as inside the holes 17a and second trench pattern 17b. Subsequently, the holes 17a and second trench pattern 17b are filled in with a second metallization material 20. Finally, as shown in FIG. 4G, unnecessary portions of the second barrier film 19 and second metallization material 20 on the interlevel dielectric film 17 are removed and the upper surfaces thereof are planarized. In this manner, the second metal interconnects 21 are formed and electrically connected to the first metal interconnect 15.

In the fourth embodiment, when the second trench pattern 17b to be linked to the holes 17a is defined in the upper part of the interlevel dielectric film 17, the parts 28A of the second positive resist 28, filled in the holes 17a, are exposed to the radiation at a dose, at which the resist 28 is photosensitive, using the same exposure mask 31 as that used to form the holes 17a. Accordingly, even those parts 28A of the second positive resist 28, which have reached the bottom of the holes 17a, can be sensitive to the radiation, and therefore, can be melted and removed when developed after that. That is to say, no residue of the resist 28c for the second trench pattern 17b is left inside the holes 17a and the second metal interconnects 21 will not be affected by any etching residue. Thus, it is possible to prevent the metal interconnects from increasing their resistance or from being disconnected from each other. As a result, highly reliable metal interconnects with improved electrical characteristics can be obtained by a dual damascene process.

In this case, the corner 17c between the top of the through hole 17a and the bottom of the second trench pattern 17b is rounded. Accordingly, even if the diameter of the holes 17a is relatively small, the second metallization material can reach the bottom of the holes 17a just as intended. For that reason, the first and second metal interconnects 15 and 21 are much less likely to be disconnected from each other. Thus, decrease in reliability of the interconnects, which might be caused if the metallization material could not be filled in sufficiently, is avoidable according to this embodiment.

It should be noted that the first barrier film 13 and passivation film 16 are not always necessary.

What is claimed is:

1. A method of forming an interconnect, comprising the steps of:

a) forming a through hole Through an insulating film over a substrate;

b) depositing a negative resist over the insulating film as well as inside the through hole;

c) patterning the negative resist thereby forming a mask pattern which has an opening located over the through hole and is used to define a trench, the mask pattern being formed by completely removing the negative resist inside the through hole;

d) preforming a dry etching in which sputtered atoms are ejected with respect to the insulating film using the mask pattern as a mask thereby defining a trench pattern which is linked to the through hole in an upper part of the insulating film, the dry etching rounding a corner between the top of the through hole and the bottom of the trench pattern in the insulating film by the sputtered atoms; and e) filling in the through hole and the trench pattern with a conductive material.

2. The method of claim 1, wherein in the step d), the dry etching is performed by using a mixture containing $CH_4$, $CHF_3$ and Ar gases.

* * * * *